(12) United States Patent
Fukui et al.

(10) Patent No.: US 11,344,931 B2
(45) Date of Patent: May 31, 2022

(54) METHOD OF REMOVING PARTICLES OF SUBSTRATE PROCESSING APPARATUS, AND SUBSTRATE PROCESSING APPARATUS

(71) Applicant: Tokyo Electron Limited, Tokyo (JP)

(72) Inventors: Shogo Fukui, Kumamoto (JP); Gentaro Goshi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/532,918

(22) Filed: Aug. 6, 2019

(65) Prior Publication Data

US 2020/0047224 A1 Feb. 13, 2020

(30) Foreign Application Priority Data

Aug. 7, 2018 (JP) .............................. JP2018-148625

(51) Int. Cl.
*B08B 9/08* (2006.01)
*H01L 21/02* (2006.01)

(52) U.S. Cl.
CPC .......... *B08B 9/08* (2013.01); *H01L 21/02046* (2013.01)

(58) Field of Classification Search
CPC ......... H01L 21/67017; H01L 21/02046; H01L 21/67051; H01L 21/6719; H01L 21/02041; H01L 21/02076; H01L 21/02101; H01L 21/67028; H01L 21/67034; H01L 21/6715; B08B 9/08
See application file for complete search history.

(56) References Cited

U.S. PATENT DOCUMENTS

| 2014/0144462 A1* | 5/2014 | Verhaverbeke ... H01L 21/67742 134/1.2 |
| 2017/0069485 A1* | 3/2017 | Jeong ................ H01L 21/02101 |
| 2018/0138035 A1* | 5/2018 | Ohno .................. H01L 21/6719 |

FOREIGN PATENT DOCUMENTS

JP 2013-251550 A 12/2013

* cited by examiner

*Primary Examiner* — Douglas Lee
(74) *Attorney, Agent, or Firm* — Abelman, Frayne & Schwab

(57) ABSTRACT

A method of removing particles of a substrate processing apparatus includes a pressure increasing process, a circulating process, and a particle removing process. In the pressure increasing process, a pressure in a processing space is increased by supplying a cleaned fluid from a first supply line to the processing space in a state where a second on-off valve and a third on-off valve are closed. In the circulating process, a processing fluid is supplied from a second supply line to the processing space and discharged from a discharge line by opening the second on-off valve and the third on-off valve after the pressure increasing process. In the particle removing process, a flow of the cleaned fluid is generated against the pressure of the processing space in the second supply line by opening and closing the second on-off valve during the pressure increasing process.

20 Claims, 9 Drawing Sheets

METHOD OF REMOVING PARTICLES OF SUBSTRATE PROCESSING APPARATUS, AND SUBSTRATE PROCESSING APPARATUS

CROSS-REFERENCE TO RELATED APPLICATIONS

The present application is based on and claims priority from Japanese Patent Application No. 2018-148625, filed on Aug. 7, 2018, with the Japan Patent Office, the disclosure of which is incorporated herein in its entirety by reference

TECHNICAL FIELD

The present disclosure relates to a method of removing a particle of a substrate processing apparatus, and a substrate processing apparatus.

BACKGROUND

In a drying process of related art performed after treating the surface of a substrate such as a semiconductor wafer with a liquid, a technique is known in which the substrate is dried by bringing the substrate in a state where the surface thereof is wet with the liquid into contact with a processing fluid of a supercritical state.

Japanese Patent Laid-open Publication No. 2013-251550 discloses a substrate processing apparatus including a chamber that accommodates a substrate, an upper supply port that is connected to an upper portion of the chamber to supply a supercritical fluid to a surface of the substrate, and a lower supply port that is connected to a lower portion of the chamber to supply the supercritical fluid to the surface of the substrate. Also, Japanese Patent Laid-open Publication No. 2013-251550 discloses that in order to prevent the processing fluid supplied from the upper supply port from liquefying and dropping onto the substrate, the processing fluid is first supplied to the chamber from the lower supply port to make an internal pressure of the chamber reach a critical pressure.

SUMMARY

An embodiment of the present disclosure provides a method of removing particles of a substrate processing apparatus in which a drying process is performed by bringing a substrate in a state where the surface is wet with liquid into contact with a processing fluid of a supercritical state to dry the substrate. The substrate processing apparatus includes a processing container, a first supply line, a second supply line, and a discharge line. The processing container has a processing space capable of accommodating the substrate. The first supply line includes a first on-off valve and supplies a processing fluid to the processing space. The second supply line includes a second on-off valve and supplies the processing fluid to the processing space. The discharge line includes a third on-off valve and discharges the processing fluid from the processing space. The method includes a pressure increasing process, a circulating process, and a particle removing process. In the pressure increasing process, the pressure in the processing space is increased by supplying a cleaned fluid from the first supply line to the processing space in a state where the second on-off valve and the third on-off valve are closed. In the circulating process, the processing fluid is supplied from the second supply line to the processing space and discharged from the discharge line by opening the second on-off valve and the third on-off valve after the pressure increasing process. In the particle removing process, a flow of the cleaned fluid is generated against the pressure of the processing space in the second supply line by opening and closing the second on-off valve during the pressure increasing process.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
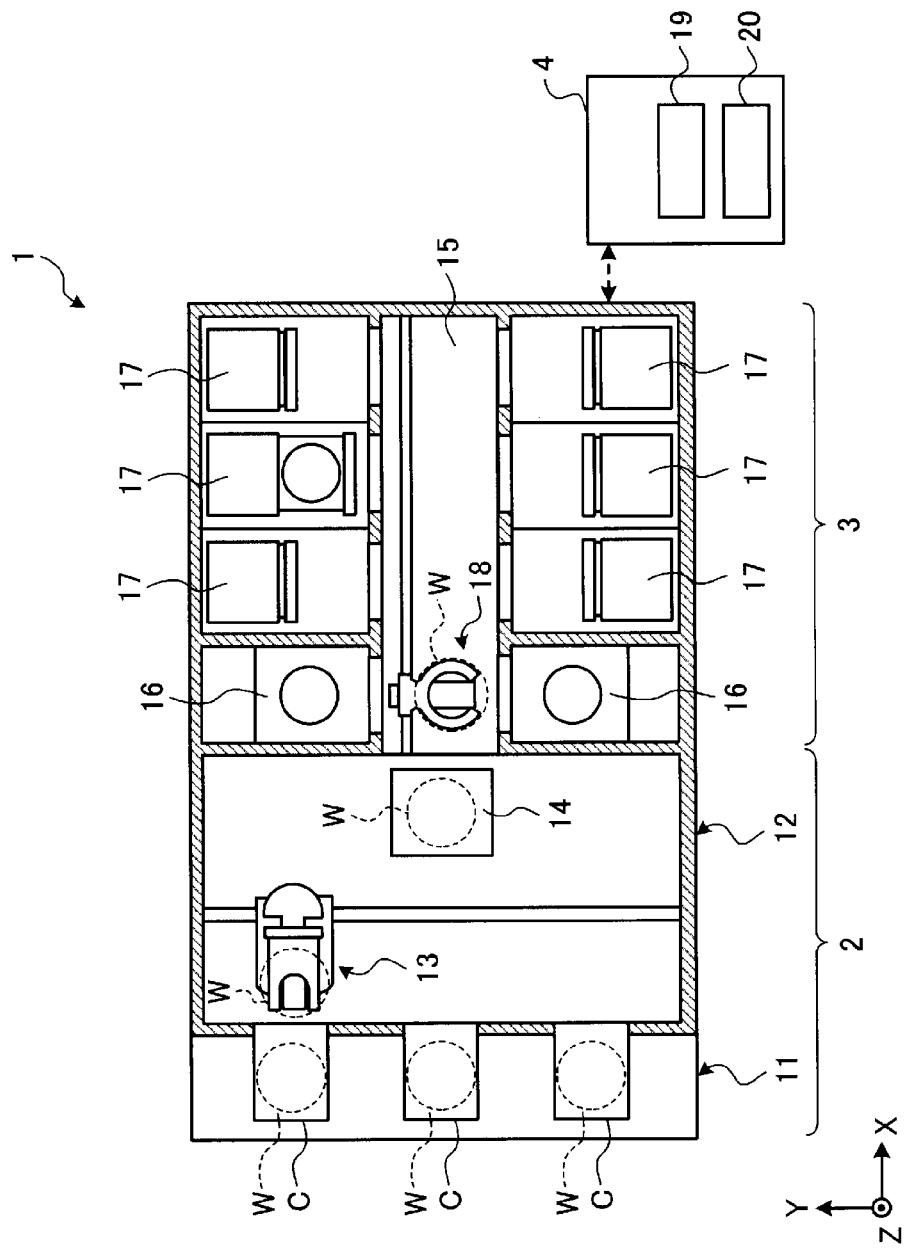
FIG. 1 is a view illustrating a schematic configuration of a substrate processing system according to an embodiment.

In the following detailed description, reference is made to the accompanying drawings which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments to implement a method of removing a particle of a substrate processing apparatus, and the substrate processing apparatus according to the present disclosure (hereinafter, referred to as an "embodiment") will be described in detail with reference to the drawings. In addition, the method of removing a particle of a substrate processing apparatus, and the substrate processing apparatus according to the present disclosure are not limited by the embodiments. Moreover, it is possible to combine each of the embodiments suitably in a range which does not make contradictory processing contents. Furthermore, in each of the following embodiments, the same reference numerals will be attached to the same portions, and redundant descriptions thereof will be omitted.

<Overview of Substrate Processing System>

First, a schematic configuration of a substrate processing system according to an embodiment will be described with reference to FIG. 1. FIG. 1 is a view illustrating a schematic configuration of a substrate processing system according to the embodiment. In the following, in order to clarify the positional relationship, the X axis, the Y axis, and the Z axis which are orthogonal to each another are defined, and the positive direction of the Z axis is considered as the vertically upward direction.

As illustrated in FIG. 1, the substrate processing system 1 includes a carry-in/carry-out station 2 and a processing station 3. The carry-in/carry-out station 2 and the processing station 3 are provided adjacent to each other.

The carry-in/carry-out station 2 includes a carrier placement unit 11 and a transferor 12. A plurality of carriers C that accommodate a plurality of semiconductor wafers in a horizontal state (hereinafter, referred to as a "wafer W") are placed on the carrier placement unit 11.

The transferor 12 is provided adjacent to the carrier placement unit 11 and includes a substrate transfer device 13 and a deliverer 14 inside. The substrate transfer apparatus 13 includes a wafer holding mechanism that holds the wafer W. In addition, the substrate transfer apparatus 13 may move in the horizontal direction and the vertical direction and may pivot around the vertical axis, and transfer the wafer W between the carrier C and the deliverer 14 using the wafer holding mechanism.

The processing station 3 is provided adjacent to the transferor 12. The processing station 3 includes a transferor 15, a plurality of cleaning processing units 16, and a plurality of drying processing units 17. The plurality of cleaning processing units 16 and the plurality of drying processing units 17 are provided side by side on the both sides of the transferor 15. The arrangement and the number of the cleaning processing unit 16 and the drying processing unit 17 illustrated in FIG. 1 are examples and are not limited to those illustrated in the figure.

The transferor 15 includes a substrate transfer device 18 inside. The substrate transfer device 18 includes a wafer holding mechanism that holds the wafer W. In addition, the substrate transfer device 18 may move in the horizontal direction and the vertical direction and may pivot about the vertical axis, and the wafer holding mechanism is used to perform the transfer of the wafer W among the deliverer 14, the cleaning processing unit 16, and the drying processing unit 17.

The cleaning processing unit 16 performs a predetermined cleaning process on the wafer W transferred by the substrate transfer device 18. A configuration example of the cleaning processing unit 16 will be described later.

The drying processing unit 17 performs the above-described drying process on the wafer W cleaned by the cleaning processing unit 16. A configuration example of the drying processing unit 17 will be described later.

The substrate processing system 1 further includes a control device 4. The control device 4 is, for example, a computer and includes a controller 19 and a storage 20.

The controller 19 includes a microcomputer having a central processing unit (CPU), a read only memory (ROM), a random access memory (RAM), an input/output port, and various circuits. The CPU of the microcomputer implements the control to be described later by reading and executing the program stored in the ROM.

The program may be recorded in a computer-readable recording medium and may be installed in the storage 20 of the control device 4 from the recording medium. Examples of the computer-readable recording medium include a hard disk (HD), a flexible disk (FD), a compact disk (CD), a magneto-optical disk (MO), a memory card, and the like.

The storage 20 is implemented by, for example, a semiconductor memory device such as a RAM or a flash memory, or a storage device such as a hard disk or an optical disk.

In the substrate processing system 1 configured as described above, first, the substrate transfer device 13 of the carry-in/carry-out station 2 takes out the wafer W from the carrier C placed on the carrier placement unit 11 and mounts the taken-out wafer W onto the deliverer 14. The wafer W placed on the deliverer 14 is taken out of the deliverer 14 by the substrate transfer device 18 of the processing station 3 and carried into the cleaning processing unit 16.

The wafer W carried into the cleaning processing unit 16 is subjected to the cleaning processing by the cleaning processing unit 16, and then carried out of the cleaning processing unit 16 by the substrate transfer device 18. The wafer W carried out of the cleaning processing unit 16 is carried into the drying processing unit 17 by the substrate transfer device 18 and subjected to the drying process by the drying processing unit 17.

The wafer W subjected to the drying process by the drying processing unit 17 is carried out from the drying processing unit 17 by the substrate transfer device 18 and placed on the deliverer 14. Then, the processed wafer W placed on the deliverer 14 is returned to the carrier C of the carrier placement unit 11 by the substrate transfer device 13.

<Configuration of Cleaning Processing Unit>

Figure 2:
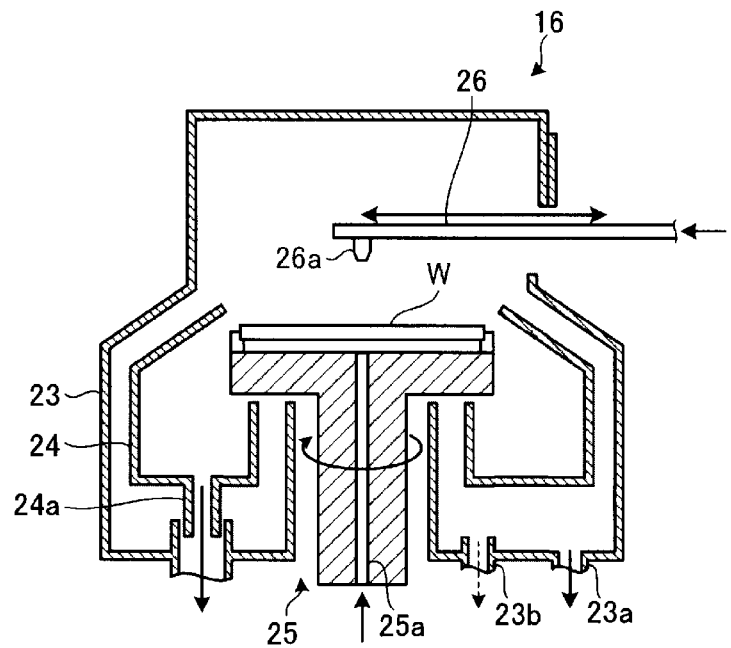
FIG. 2 is a cross-sectional view illustrating an example of the configuration of a cleaning processing unit.

Next, the configuration of the cleaning processing unit 16 will be described with reference to FIG. 2. FIG. 2 is a cross-sectional view illustrating an example of the configuration of the cleaning processing unit 16. The cleaning processing unit 16 is configured as a single-wafer cleaning processing unit that cleans the wafers W one by one, for example, by spin cleaning.

As illustrated in FIG. 2, the cleaning processing unit 16 holds the wafer W substantially horizontally with the wafer holding mechanism 25 disposed in the outer chamber 23 that forms a processing space, and rotates the wafer W by rotating the wafer holding mechanism 25 around the vertical axis. In addition, the cleaning processing unit 16 causes a nozzle arm 26 to be advanced into the upper side of the rotating wafer W and performs a cleaning process of the surface of the wafer W by supplying a chemical liquid and a rinse liquid from a chemical liquid nozzle 26a provided at the front edge portion of the nozzle arm 26 in a predetermined order.

Further, in the cleaning processing unit 16, a chemical liquid supply line 25a is also formed inside the wafer holding mechanism 25. Then, the back surface cleaning of the wafer W is performed by the chemical liquid and the rinse liquid supplied from the chemical liquid supply line 25a.

In the above-described cleaning process for the wafer W, for example, a removal of particles and organic contaminants is first performed by an SC1 liquid (a mixture of ammonia and hydrogen peroxide), which is an alkaline chemical liquid, and then rinse cleaning is performed by deionized water (hereinafter, referred to as "DIW"), which is a rinse liquid. Next, a natural oxide film is removed by a diluted hydrofluoric acid (hereinafter, referred to as "DHF") aqueous solution, which is an acidic chemical liquid, and then rinse cleaning with DIW is performed.

The various chemical liquids described above are received by the outer chamber 23 or an inner cup 24 disposed in the outer chamber 23, and are discharged from a drain port 23a provided in the bottom portion of the outer chamber 23 or a drain port 24a provided in the bottom portion of the inner cup 24. Further, the atmosphere in the outer chamber 23 is exhausted from an exhaust port 23b provided in the bottom portion of the outer chamber 23.

After the rinse process of the wafer W described above, an isopropyl alcohol (IPA) in a liquid state (hereinafter, referred to as an "IPA liquid") is supplied to the front and back surfaces of the wafer W while the wafer holding mechanism 25 is rotated, and the DIW remaining on both the surfaces of wafer W is replaced with the IPA liquid. Thereafter, the rotation of the wafer holding mechanism 25 is gradually stopped.

The wafer W that is cleaned in this way is delivered to the substrate transfer device 18 by a transfer mechanism (not illustrated) provided in the wafer holding mechanism 25 in a state where the IPA liquid is filled on the surface of the wafer W, in other words, a state where the liquid film of the IPA liquid is formed on the surface of the wafer W. Thereafter, the wafer W is carried out from the cleaning processing unit 16.

The IPA liquid filled on the wafer W functions as a drying preventing liquid which prevents the pattern on the surface of the wafer W from collapsing due to evaporation (vaporization) of the liquid on the surface of the wafer W during transfer of the wafer W.

After the cleaning process in the cleaning processing unit 16 is completed, the wafer W having the IPA liquid filled on the surface thereof is transferred to the drying processing unit 17. In addition, the processing fluid of a supercritical state (hereinafter, referred to as a "supercritical fluid") is brought into contact with the IPA liquid on the surface of the wafer W in the drying processing unit 17 so that the IPA liquid is dissolved into the supercritical fluid and removed from the wafer W to dry the wafer W.

<Configuration of Drying Processing Unit>

Figure 3:
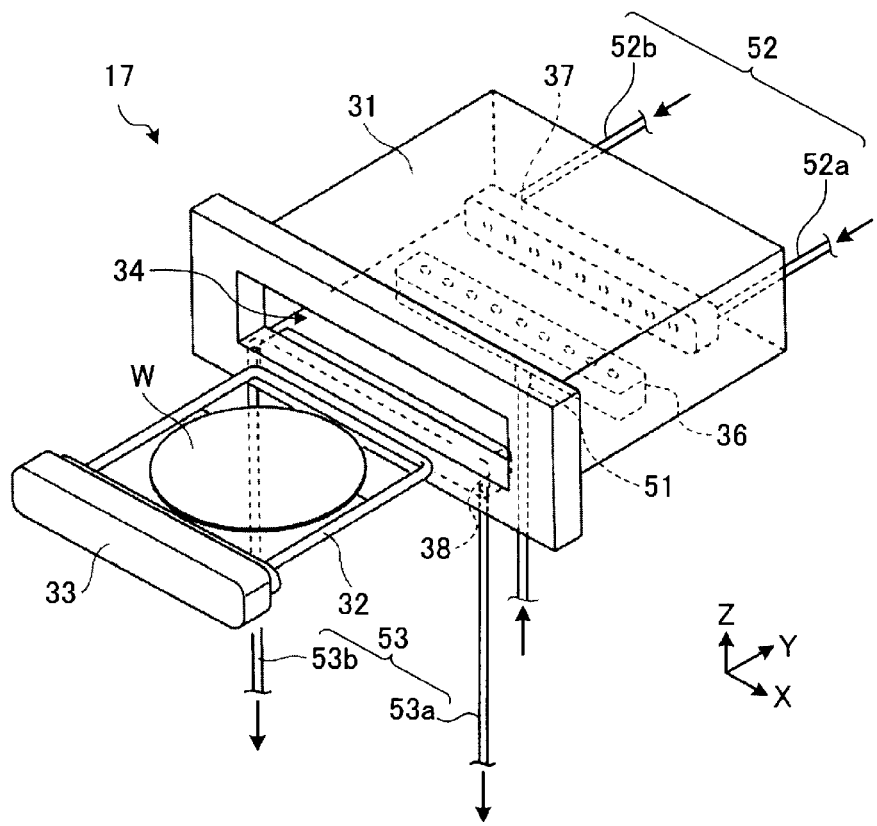
FIG. 3 is an external perspective view illustrating an example of the configuration of a drying processing unit.

Next, the configuration of the drying processing unit 17 will be described with reference to FIG. 3. FIG. 3 is an external perspective view illustrating an example of the configuration of the drying processing unit 17.

As illustrated in FIG. 3, the drying processing unit 17 has a processing container 31, a holding plate 32, and a lid member 33. An opening 34 is formed in the processing container 31 in order to carry in/out a wafer W therethrough. The holding plate 32 horizontally holds the wafer W which is a processing target. The lid member 33 supports the holding plate 32 and seals the opening 34 when the wafer W is carried into the processing container 31.

The processing container 31 has a processing space that is capable of accommodating a wafer W having a diameter of, for example, 300 mm. The processing space is provided with a first supply header 36, a second supply header 37, and a discharge header 38. The first supply header 36, the second supply header 37, and the discharge header 38 are provided with a plurality of openings arranged along the longitudinal direction, specifically, the horizontal direction (X-axis direction) orthogonal to the carry-in/carry-out direction of the wafer W (Y-axis direction).

The first supply header 36 is connected to a first supply line 51 and supplies the processing fluid supplied from the first supply line 51 to the processing space.

Specifically, the first supply header 36 is disposed in the bottom portion of the processing space in a state where the plurality of openings are caused to face upward, and supplies the processing fluid toward the back surface of the wafer W from below the wafer W accommodated in the processing space (not illustrated). Here, the first supply header 36 only needs to supply the processing fluid to the processing space from at least below the wafer W, and it is not always necessary to supply the processing fluid upward.

The second supply header 37 is connected to a second supply line 52 and supplies the processing fluid supplied from the second supply line 52 to the processing space. The downstream side end of the second supply line 52 branches off into a first branch supply line 52a and a second branch supply line 52b. The first branch supply line 52a is connected to one end of the second supply header 37 in the longitudinal direction thereof, and the second branch supply line 52b is connected to the other end of the second supply header 37 in the longitudinal direction thereof.

The second supply header 37 is provided adjacent to the side surface opposite to the opening 34 in the processing space. The plurality of openings formed in the second supply header 37 are disposed above the wafer W (not illustrated) accommodated in the processing space so as to face the opening 34. The second supply header 37 supplies the processing fluid, which is supplied from the second supply line, substantially horizontally toward the opening 34 from the side surface opposite to the opening 34 in the processing space.

The discharge header 38 is connected to a discharge line 53, is adjacent to the side surface on the opening 34 side in the processing space, and is provided below the opening 34. The plurality of openings formed in the discharge header 38 face the second supply header 37. The discharge header 38 discharges the processing fluid in the processing space to the discharge line 53. Further, the upstream side end of the discharge line 53 branches off into a first branch discharge line 53a and a second branch discharge line 53b. The first branch discharge line 53a is connected to one end of the discharge header 38 in the longitudinal direction thereof, and the second branch discharge line 53b is connected to the other end of the discharge header 38 in the longitudinal direction thereof.

The drying processing unit 17 supplies the processing fluid from the first supply line 51 to the processing space of the processing container 31 via the first supply header 36, thereby increasing the pressure in the processing space (this refers to a pressure increasing process to be described later).

Thereafter, the drying processing unit 17 supplies the processing fluid from the second supply line 52 to the processing space via the second supply header 37 while the processing fluid supplied to the processing space is discharged via the discharge header 38 (this refers to a circulating process to be described later). As a result, a laminar flow of the processing fluid that flows in a predetermined direction around the wafer W is formed in the processing space. The laminar flow of the processing fluid flows, for example, from the second supply header 37 toward the upper portion of the opening 34 above the wafer W along the surface of the wafer W. In addition, the laminar flow of the processing fluid is directed downward above the opening 34 and flows through the vicinity of the opening 34 toward the discharge header 38.

Figure 4:
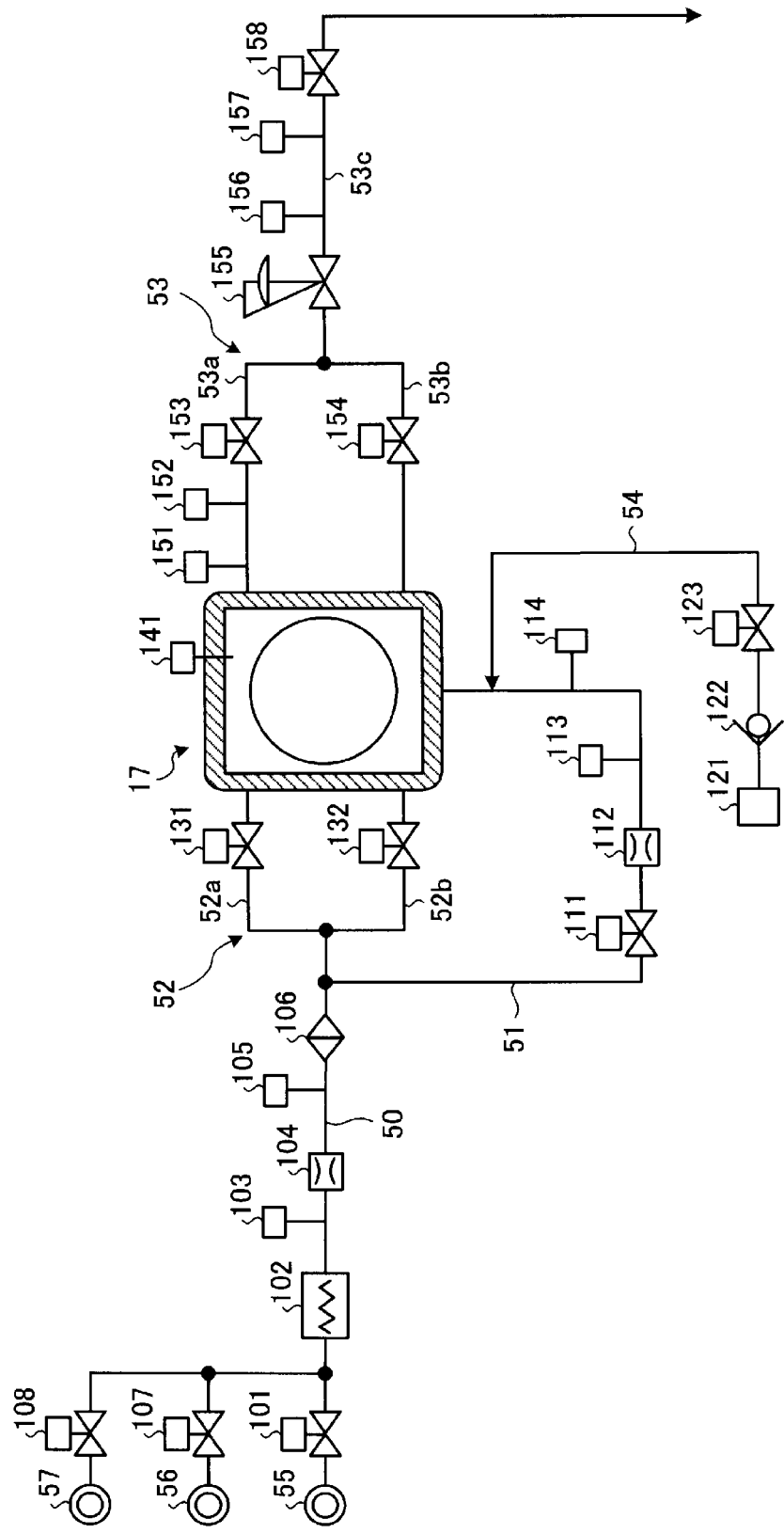
FIG. 4 is a view illustrating an example of the configuration of supply lines and discharge lines connected to the drying processing unit.

Next, the configuration of the supply lines and the discharge lines connected to the drying processing unit 17 will be described with reference to FIG. 4. FIG. 4 is a view illustrating an example of the configuration of the supply lines and the discharge lines connected to the drying processing unit 17.

As illustrated in FIG. 4, the supply lines of the processing fluid include an upstream supply line 50, a first supply line 51, and a second supply line 52.

The upstream supply line 50 is connected to a fluid supply source 55 which is a supply source of the processing fluid at one end and is connected to the first supply line 51 and the second supply line 52 at the other end. The fluid supply source 55 is, for example, a tank that stores $CO_2$, which is an example of the processing fluid. The processing fluid stored in the fluid supply source 55 is supplied to the first supply line 51 and the second supply line 52 through the upstream side supply line 50.

A valve 101, a heater 102, a pressure sensor 103, an orifice 104, a temperature sensor 105, and a filter 106 are provided in this order from the upstream side to the downstream side in the middle of the upstream supply line 50. The terms "upstream" and "downstream" mentioned herein refer to the flow direction of the processing fluid in the supply line.

The valve 101 is a valve that switches on and off the supply of the processing fluid from the fluid supply source 55, and causes the supercritical fluid to flow through the downstream supply line in the open state thereof and does not cause the supercritical fluid to flow through the downstream supply line in the closed state thereof. For example, when the valve 101 is in the open state, the processing fluid which is pressurized to about 16 to 20 MPa and brought into the supercritical state is supplied from the fluid supply source 55 to the upstream supply line 50 via the valve 101.

The heater 102 heats the processing fluid that flows through downstream side of the valve 101. The pressure sensor 103 detects the pressure of the processing fluid that flows through the upstream supply line 50 between the heater 102 and the orifice 104.

The orifice 104 regulates a pressure of the processing fluid supplied from the fluid supply source 55. The orifice 104 causes the processing fluid whose pressure is adjusted to about 16 Mpa, to flow through, for example, the upstream supply line 50 of the downstream side of the orifice 104. The temperature sensor 105 detects the temperature of the processing fluid that flows through the upstream supply line 50 between the orifice 104 and the filter 106. The filter 106 removes foreign matters contained in the processing fluid that flows through the upstream supply line 50.

In addition to the fluid supply source 55, fluid supply sources 56 and 57 are connected to the upstream side supply line 50. The fluid supply source 56 is a supply source of IPA, and is connected, for example, between the valve 101 and the heater 102 in the upstream supply line 50 via a valve 107. The fluid supply source 57 is a supply source of inert gas (e.g., $N_2$), and is connected, for example, between the valve 101 and the heater 102 in the upstream supply line 50 via a valve 108.

A valve 111, an orifice 112, a pressure sensor 113, and a temperature sensor 114 are provided in the middle of the first supply line 51.

The valve 111 is a valve that switches on and off the supply of the processing fluid to the first supply header 36 (see FIG. 3) of the drying processing unit 17. The orifice 112 regulates the pressure of the processing fluid that flows through the first supply line 51. The pressure sensor 113 detects the pressure of the processing fluid that flows through the first supply line 51. The temperature sensor 114 detects the temperature of the processing fluid that flows through the first supply line 51.

Further, the first supply line 51 is connected to a purge line 54 on the downstream side of the temperature sensor 114. The purge line 54 has one end connected to a purge gas supply source 121 and the other end connected to the first supply line 51. The purge gas supply source 121 is a tank that stores, for example, a purge gas. The purge gas is an inert gas such as, for example, $N_2$. A check valve 122 and a valve 123 are provided in the middle of the purge line 54 in order from the purge gas supply source 121 side to the first supply line 51 side. The purge gas stored in the purge gas supply source 121 is, for example, supplied to the processing space of the drying processing unit via the purge line 54 and the first supply line 51 while the supply of the processing fluid to the processing space of the drying processing unit 17 is stopped.

The second supply line 52 is connected to the upstream supply line 50 on the upstream side and branches off into the first branch supply line 52a and the second branch supply line 52b on the downstream side, which are in turn connected to the second supply header 37 of the drying processing unit 17 (see FIG. 3).

A valve 131 is provided in the first branch supply line 52a. Further, a valve 132 is provided in the second branch supply line 52b. The valve 131 and the valve 132 are valves that switch on and off the supply of the processing fluid to the second supply header 37.

The drying processing unit 17 is provided with a temperature sensor 141. The temperature sensor 141 detects the temperature of the processing space in the drying processing unit 17.

The discharge line 53 branches off into a first branch discharge line 53a and a second branch discharge line 53b on the upstream side. The first branch discharge line 53a and the second branch discharge line 53b join on the downstream side.

In the first branch discharge line 53a, a temperature sensor 151, a pressure sensor 152, and a valve 153 are provided in order from the upstream side to the downstream side, and a valve 154 is provided in the second branch discharge line 53b. The temperature sensor 151 detects the temperature of the processing fluid that flows through the first branch discharge line 53a. The pressure sensor 152 detects the pressure of the processing fluid that flows through the first branch discharge line 53a. The valve 153 and the valve 154 are valves that switch on and off the discharge of the processing fluid from the drying processing unit 17.

A downstream discharge line 53c, which is the discharge line 53 on the downstream sides of the first branch discharge line 53a and the second branch discharge line 53b, is provided with a pressure adjustment valve 155, a pressure sensor 156, a temperature sensor 157, and a valve 158 which are sequentially arranged from the upstream side to the downstream side.

The pressure adjustment valve 155 is a valve that adjusts the pressure of the processing fluid which flows through the downstream discharge line 53c, and is configured by, for example, a back pressure valve. The opening degree of the pressure adjustment valve 155 is adaptively adjusted under the control of the control device 4 according to the pressure of the processing space of the drying processing unit 17. The pressure sensor 156 detects the pressure of the processing fluid that flows through the downstream discharge line 53c. The temperature sensor 157 detects the temperature of the processing fluid that flows through the downstream discharge line 53c. The valve 158 is a valve that switches on/off the discharge of the processing fluid to the outside. When the processing fluid is discharged to the outside, the valve 158 is opened, and when the processing fluid is not discharged, the valve 158 is closed.

<Specific Operation of Drying Processing Unit>

Figure 5:
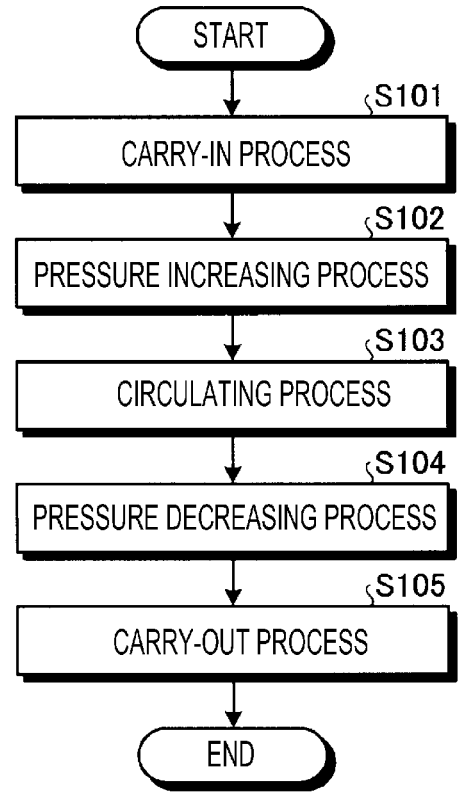
FIG. 5 is a flowchart illustrating an example of the procedure of each process performed by the drying processing unit.
Figure 6:
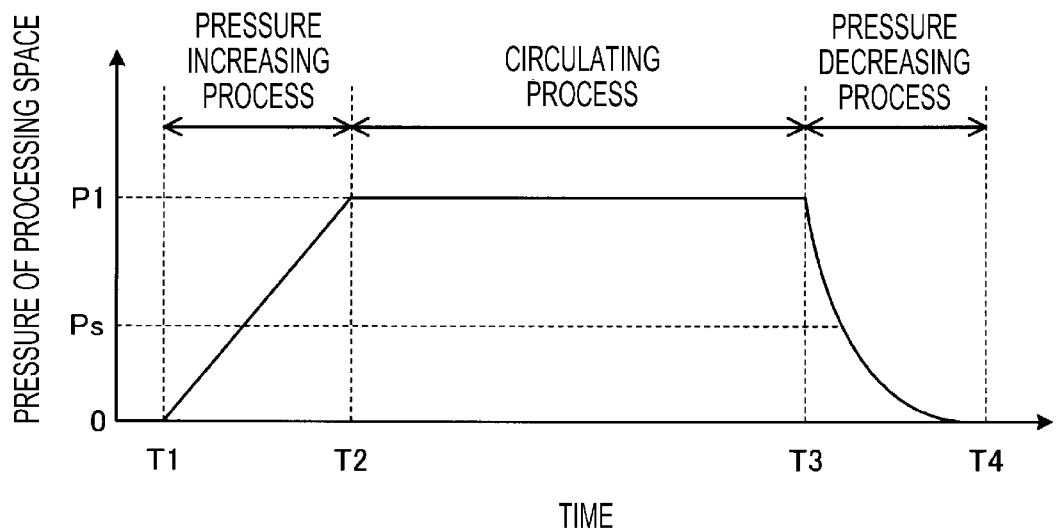
FIG. 6 is a view illustrating an example of a temporal change in pressure of the processing space at the time of a pressure increasing process, a circulating process, and a pressure decreasing process.

Next, the specific operation of the drying processing unit 17 will be described with reference to FIGS. 5 and 6. FIG. 5 is a flowchart illustrating an example of the procedure of each process performed by the drying processing unit 17. Further, FIG. 6 is a view which illustrates an example of the temporal change in the pressure of the processing space at the time of a pressure increasing process, a circulating process, and a pressure decreasing process.

Further, each processing procedure illustrated in FIG. 5 is performed when the controller 19 reads the program stored in the storage 20 of the control device 4 controls the drying processing unit 17 based on the read instruction.

Further, at the time of start of the carry-in process in step S101, all the valves 101, 111, 123, 131, 132, 153, 154, and 158 and the pressure adjustment valve 155 illustrated in FIG. 4 are in the closed state.

As illustrated in FIG. 5, a carry-in process in which the wafer W having the IPA liquid filled thereon is carried into the processing space is first performed in the drying processing unit 17 (step S101). In the carry-in process, the wafer W having the IPA liquid filled thereon is held by the holding plate 32 (see FIG. 3). Thereafter, the holding plate 32 and the lid member 33 are accommodated inside the processing container 31 together with the wafer W, and the opening 34 is sealed by the lid member 33.

Subsequently, a pressure increasing process is performed in the drying processing unit 17 (step S102). In the pressure increasing process, the valve 101 provided in the upstream supply line 50 and the valve 111 provided in the first supply line 51 are opened. As a result, the processing fluid in the supercritical state is supplied to the processing space from the fluid supply source 55 through the upstream supply line 50 and the first supply line 51.

In the pressure increasing process, the valves 131 and 132 of the second supply line 52 and the valves 153 and 154 of the discharge line 53 are closed. Therefore, the pressure of the processing space is increased by supplying the processing fluid to the processing space. Specifically, as illustrated in FIG. 6, the pressure in the processing space rises from the atmospheric pressure to a processing pressure P1 by performing the pressure increasing process from time T1 to time T2. The processing pressure P1 is a pressure that exceeds a critical pressure Ps at which $CO_2$ serving as the processing fluid becomes a supercritical state (about 7.2 MPa), and is, for example, about 16 MPa. By this pressure increasing process, the processing fluid in the processing space undergoes a phase change to a supercritical state, and the IPA liquid filled on the surface of the wafer W starts to be dissolved into the processing fluid in the supercritical state.

Further, in the pressure increasing process, the processing fluid is supplied from the first supply header 36 disposed below the wafer W (see FIG. 3) to the back surface of the wafer W. Thus, the processing liquid is brought into contact with the surface of the wafer W to prevent the IPA liquid filled on the surface of the wafer W from spilling out.

Subsequently, the circulating process is performed in the drying processing unit 17 (step S103). In the circulating process, the valve 111 of the first supply line 51 is closed, and the valves 131 and 132 of the second supply line 52, and the valves 153, 154, and 158 and the pressure adjustment valve 155 of the discharge line 53 are opened. Therefore, a laminar flow of the processing fluid is formed in the processing space from the second supply header 37 toward the discharge header 38 above the wafer W along the surface of the wafer W.

In the circulating process, the pressure in the processing space is maintained at a pressure at which the supercritical state of the processing fluid is maintained. Specifically, as illustrated in FIG. 6, the pressure in the processing space is maintained at the processing pressure P1 from time T2 to time T3 in which the circulating process is performed. By performing the circulating process, the IPA liquid remaining between the patterns on the surface of the wafer W is replaced with the processing fluid. The circulating process is performed until the IPA liquid remaining in the processing space is sufficiently reduced, for example, up to a stage where the IPA concentration in the processing space reaches 0% to several %.

In the embodiment, in the circulating process, the processing fluid is assumed to be circulated so that the pressure in the processing space is constant, but the pressure of the processing space in the circulating process does not need to be necessarily constant.

Subsequently, the pressure decreasing process is performed in the drying processing unit 17 (step S104). In the pressure decreasing process, the valves 131 and 132 of the second supply line 52 are closed. Thus, the supply of the processing fluid to the processing space is stopped. Meanwhile, since the valves 153, 154, and 158 and the pressure adjustment valve 155 of the discharge line 53 are in the open state, the processing fluid of the processing space is discharged to the outside through the discharge line 53. As a result, the pressure of the processing space decreases.

The pressure decreasing process is performed until the pressure in the processing space decreases to the atmospheric pressure. Specifically, as illustrated in FIG. 6, the pressure decreasing process is performed from time T3 to time T4, and accordingly, the pressure in the processing space is reduced from the processing pressure P1 to the atmospheric pressure.

Subsequently, the drying processing unit 17 performs the carry-out process (step S105). In the carry-out process, the holding plate 32 and the lid member 33 move to carry out the wafer W, on which the drying process has been finished, from the processing space. When the carry-out process is completed, a series of drying processes for a single wafer W is completed.

<Adhesion of Particles in Second Supply Line>

Figure 7:
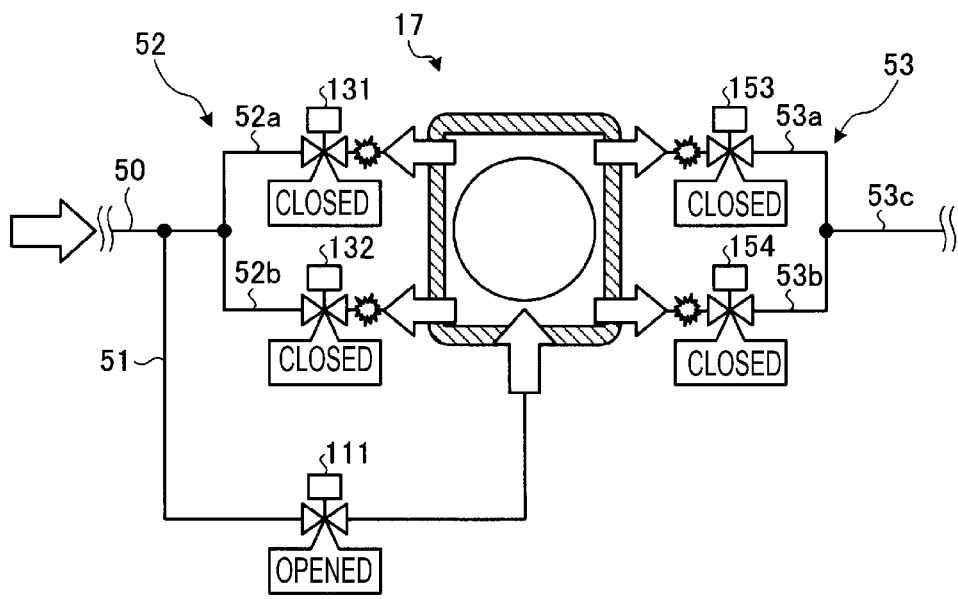
FIG. 7 is a view illustrating an example of a state where the second supply line and valves provided in the second supply line are contaminated.

FIG. 7 is a view illustrating an example of a state where the second supply line 52 and the valves 131 and 132 provided in the second supply line 52 are contaminated.

As illustrated in FIG. 7, the valves 131 and 132 of the second supply line 52 and the valves 153 and 154 of the discharge line 53 are in a closed state at the time of the pressure increasing process. For this reason, when the pressure in the processing space rises in the pressure increasing process, particles in the processing space may enter the second supply line 52 and are attached to the second supply line 52 and the valves 131 and 132 provided in the second supply line 52. The particles existing in the processing space include, for example, a substance derived from IPA removed from the surface of the wafer W, but the present disclosure is not limited to such a substance and may also include, for example, foreign matters that may not be removed by the filter 106.

When the valves 131 and 132 are opened in the circulating process, the particles, which are attached to the valves 131 and 132 and the second supply line 52 on the downstream side of the valves 131 and 132, may be ejected into the processing space to contaminate the wafer W which is a product substrate.

Therefore, the substrate processing system 1 is configured to suppress the contamination of the wafer W as a product substrate by performing a particle removing process in which particles attached to the valves 131 and 132 and the second supply line 52 on the downstream side of the valves 131 and 132 are forced to be discharged.

Further, particles in the processing space enter the discharge line 53. When the valves 153 and 154 are opened in the pressure decreasing process, particles that have entered the discharge line 53 are discharged to the downstream side of the discharge line 53 (downstream discharge line 53c). For this reason, particles that have entered the discharge line 53 may not be ejected into the processing space.

<Particle Removing Process>

Figure 8:
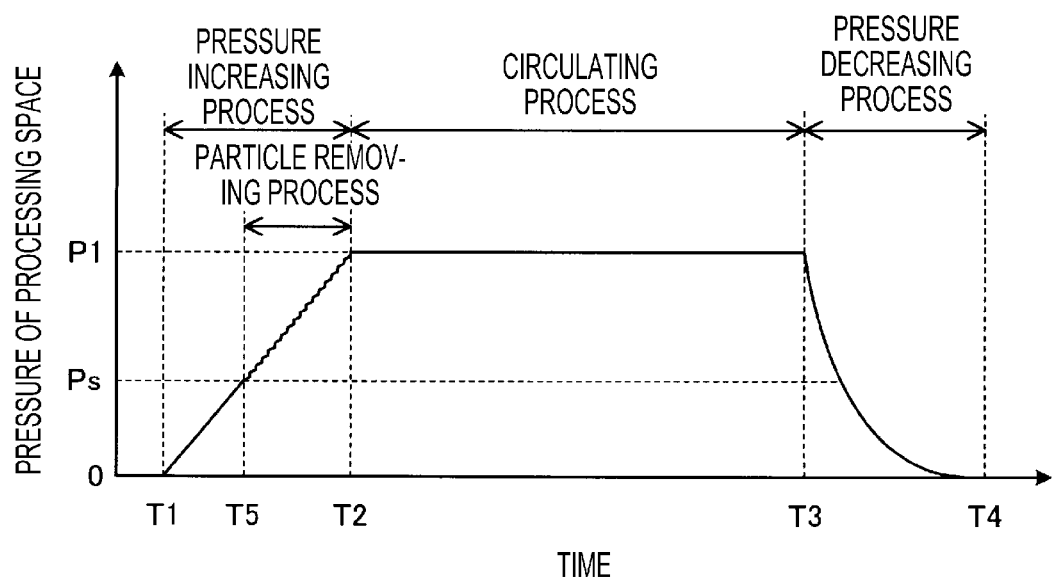
FIG. 8 is a view illustrating an example of execution timing of a particle removing process.

Next, the contents of the particle removing process according to the embodiment will be described with reference to FIGS. 8 to 12. FIG. 8 is a view illustrating an example of execution timing of the particle removing process. Further, FIGS. 9 to 12 are views illustrating an operation example of the particle removing process.

The particle removing process is performed in a state where a substrate other than the product substrate (hereinafter, referred to as a "dummy wafer") is accommodated in the processing space. The dummy wafer is carried into the processing space in a state where the liquid film of the IPA liquid is formed on the surface thereof, similarly to the wafer W which is a product substrate.

As illustrated in FIG. 8, in the drying processing unit 17, the pressure increasing process, the circulating process, and the pressure decreasing process are performed on the dummy wafer with the same recipe as the drying processing for the wafer W which is a product substrate. In such a series of drying processes, the particle removing process is performed during the pressure increasing process.

As described above, even when the particle removing process is performed, the total processing time does not differ from the processing time (time T1 to time T4) of the drying process for the product substrate, so that the decrease in throughput may be suppressed. In the series of drying processes including the particle removing process for the dummy wafer, the cleaning process of the processing space may be performed, for example, every predetermined time (e.g., 24 hours), every time the drying process is performed on a predetermined number (e.g., one lot) of wafers W.

As illustrated in FIG. 8, the particle removing process starts at the timing (time T5) when the pressure of the processing space reaches the critical pressure Ps in the pressure increasing process and ends at time T2 when the pressure increasing process ends.

Thus, the IPA liquid on the dummy wafer may be dissolved into the processing fluid in the supercritical state by performing the particle removing process at the timing when the pressure of the processing space reaches the critical pressure Ps. The IPA dissolved into the processing fluid may adsorb the particles in the processing space and the second supply line 52. Therefore, the particle removal performance may be enhanced as compared with the case where the particle removing process is performed without accommodating the dummy wafer in the processing space.

The particle removing process may start at a timing after the pressure in the processing space has reached the critical pressure Ps. In addition, the particle removing process may end at a timing earlier than time T2 when the pressure increasing process ends.

Figure 9:
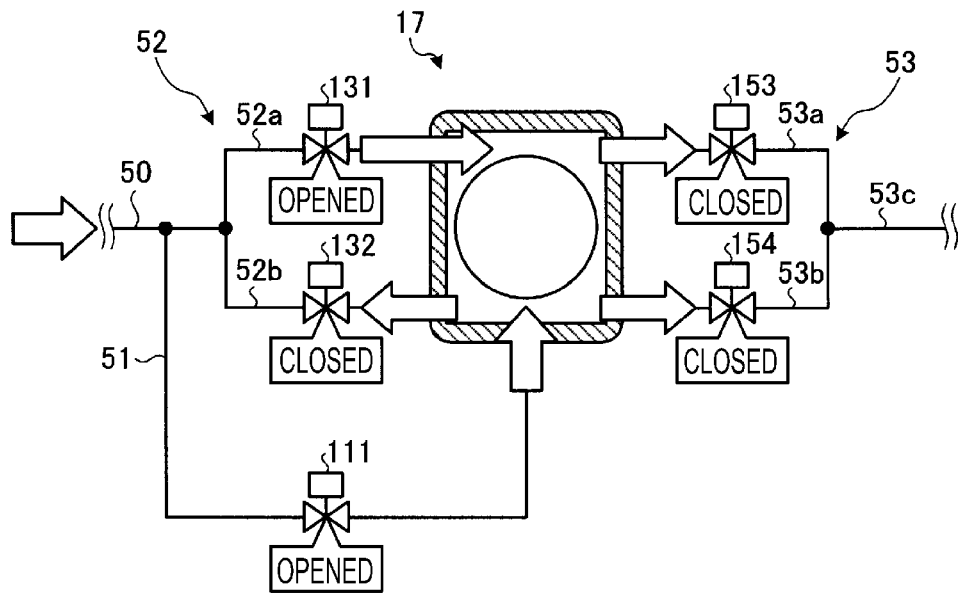
FIG. 9 is a view illustrating an operation example of the particle removing process.

As illustrated in FIG. 9, in the particle removing process, one of the two valves 131 and 132 provided in the second supply line 52 (here, the valve 131) is first opened.

In the pressure increasing process, the processing fluid adjusted to the processing pressure P1 or a pressure exceeding the processing pressure P1 is supplied to the first supply line 51 from the upstream supply line 50. Since not only the first supply line 51 but also the second supply line 52 is connected to the upstream supply line 50, the processing pressure P1 or a pressure exceeding the processing pressure P1 is applied to the primary sides of the valve 131 and the valve 132 in the second supply line 52.

Meanwhile, in the middle of the pressure increasing process, the pressure in the processing space has not yet reached the processing pressure P1, and therefore, a pressure smaller than that on the primary sides of the valves 131 and 132 is applied to the secondary sides of the valves 131 and 132.

Accordingly, when the valve 131 is opened during the pressure increasing process, a pressure difference between the primary side and the secondary side of the valve 131 causes a flow of the processing fluid to be generated in the second supply line 52 against the pressure of the processing space. This flow allows the particles attached to the first branch supply line 52a on the downstream side of the valves 131 and 131 to be discharged to the processing space. That is, the particles may be removed from the first branch supply line 52a on the downstream side of the valves 131 and 132.

The particle removing process is performed at a timing when the pressure of the processing space reaches the critical pressure Ps, in other words, at a timing when the IPA liquid formed on the surface of the dummy wafer is dissolved into the processing space. This prevents the IPA liquid from spilling out from the surface of the dummy wafer in the particle removing process.

Figure 10:
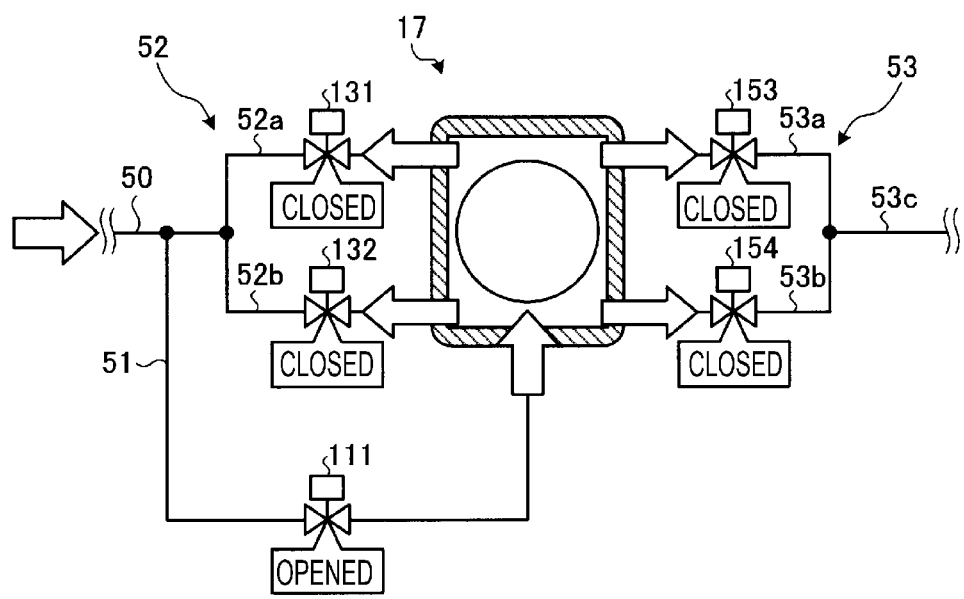
FIG. 10 is a view illustrating an operation example of the particle removing process.
Figure 11:
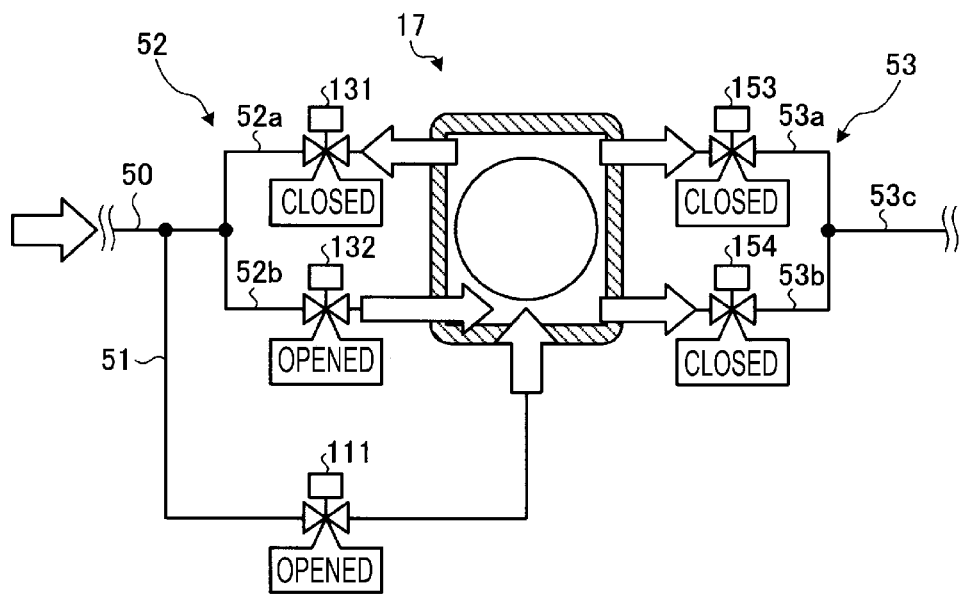
FIG. 11 is a view illustrating an operation example of the particle removing process.
Figure 12:
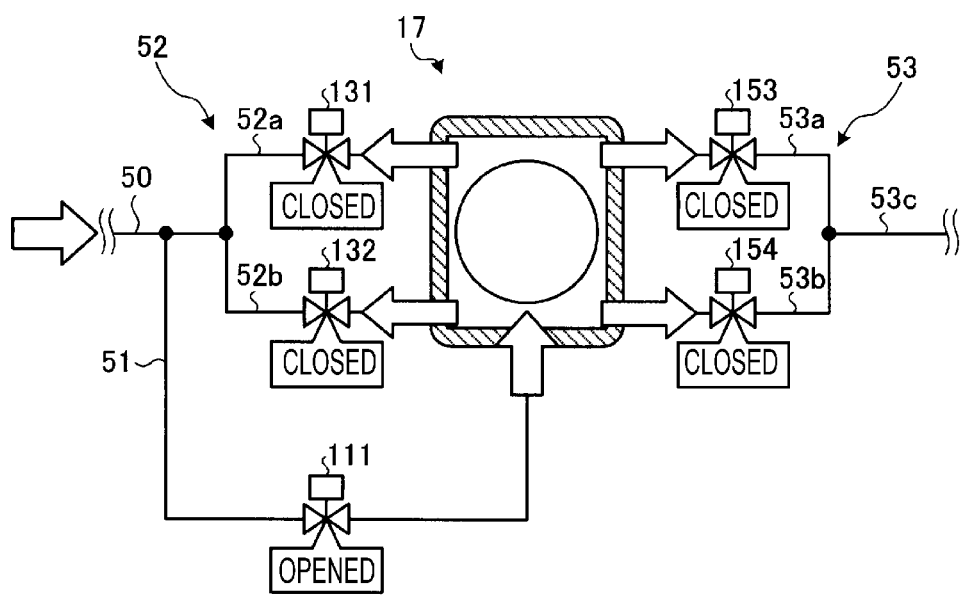
FIG. 12 is a view illustrating an operation example of the particle removing process.

Subsequently, as illustrated in FIG. 10, the valve 131 is closed, and the state where both the valves 131 and 132 are closed is maintained for a predetermined time. Thereafter, as illustrated in FIG. 11, the other valve (here, the valve 132) of the valves 131 and 132 is opened. Thus, the particles are removed from the valve 132 and the second branch supply line 52b on the downstream side of the valve 132. Thereafter, as illustrated in FIG. 12, the valve 132 is closed, and the state where both the valves 131 and 132 are closed is maintained for a predetermined time.

The particle removing process ends after repeating the operations of FIG. 9 to FIG. 12 a predetermined number of times (e.g., six times).

The pressure difference between the primary side and the secondary side of the valves 131 and 132 is largest at the moment when the valves 131 and 132 are opened. Therefore, by repeating the operation of opening the valves 131 and 132 a plurality of times, the particle removal efficiency may be enhanced, for example, as compared with the case where each of the valves 131 and 132 is opened only once.

The time at which the valves 131 and 132 are opened is set to a short time, for example, 1 second or less, preferably 0.5 seconds or less, more preferably 0.1 second or less. As described above, by setting the opening time of the valves 131 and 132 to be short, an operation of opening and closing the valves 131 and 132 within the period of time T1 to time T2 in which the pressure increasing process is performed (e.g., 1 minute) may be repeated much more. Therefore, particle removal efficiency may be enhanced while suppressing a decrease in throughput.

Also, in the particle removing process, after one of the valves 131 and 132 is opened and closed, by waiting for a predetermined time in a state where both the valves 131 and 132 are closed, the pressure difference between the primary and secondary sides of the valves 131 and 132 may be recovered. Therefore, the pressure difference when one of the valves 131 and 132 is opened may be suppressed from reducing as compared with the pressure difference when the other is opened.

In the drying processing unit 17, when the particle removing process and the pressure increasing process are completed, the circulating process is performed. The particles discharged to the processing space from the valves 131 and 132 and the second supply line 52 are discharged to the outside of the processing container 31 by this circulating process.

Figure 13:
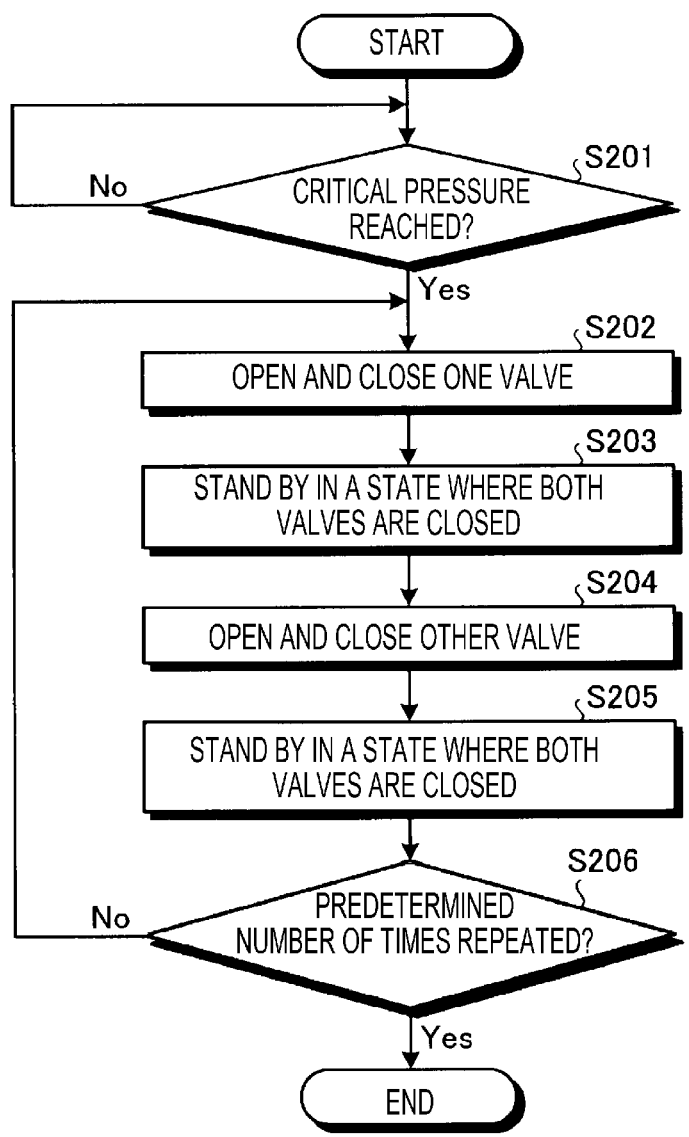
FIG. 13 is a flowchart illustrating an example of the procedure of the particle removing process.

FIG. 13 is a flowchart illustrating an example of the procedure of the particle removing process. Each processing procedure illustrated in FIG. 13 is performed when the controller 19 reads the program stored in the storage 20 of the control device 4 and controls the drying processing unit 17 based on the read instruction.

As illustrated in FIG. 13, the drying processing unit 17 determines whether the pressure of the processing space has reached the critical pressure Ps during the pressure increasing process (step S201). For example, when the pressure detected by the pressure sensor 152 (see FIG. 4) reaches the critical pressure Ps, the controller 19 determines that the pressure in the processing space has reached the critical pressure Ps. The controller 19 determines that the pressure of the processing space has reached the critical pressure Ps when a time determined in advance as the time for the pressure of the processing space to reach the critical pressure Ps has elapsed after the start of the pressure increasing process.

The controller 19 repeats the process of step S201 until the pressure of the processing space reaches the critical pressure Ps ("No" in step S201). Meanwhile, when the pressure in the processing space reaches the critical pressure Ps ("Yes" in step S201), the drying processing unit 17 opens and closes one of the valves 131 and 132 provided in the second supply line 52 (step S202). Thereafter, the drying processing unit 17 stands by for a predetermined time (e.g., 2 seconds) in a state where both of the valves 131 and 132 are closed (step S203).

Subsequently, the drying processing unit 17 opens and closes the other of the valves 131 and 132 provided in the second supply line 52 (step S204). Thereafter, the drying processing unit 17 stands by for a predetermined time (e.g., 2 seconds) in a state where both of the valves 131 and 132 are closed (step S205).

Subsequently, the controller 19 determines whether the processes of steps S202 to S205 have been repeated a predetermined number of times (step S206). In this process, when the number of times where the processes of steps S202 to S205 have been repeated does not reach the specified number ("No" in step S206), the drying processing unit 17 returns the process to step S202 and repeats the processes of steps S202 to S205. Meanwhile, when the processes of steps S202 to S205 have been repeated a predetermined number of times ("Yes" in step S206), the drying processing unit 17 ends the particle removing process.

<Performance Evaluation of Particle Removing Process>

Figure 14:
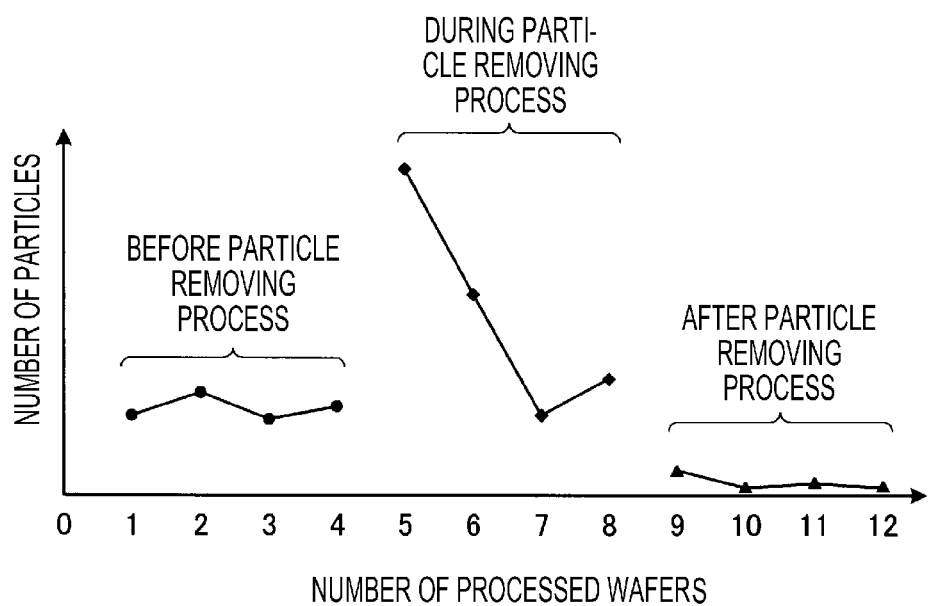
FIG. 14 is a graph illustrating the result of performance evaluation of the particle removing process according to the embodiment.

Next, the result of performance evaluation of the particle removing process will be described with reference to FIG. 14. FIG. 14 is a graph illustrating the result of performance evaluation of the particle removing process according to the embodiment.

The horizontal axis of the graph illustrated in FIG. 14 indicates the number of processed wafers (dummy wafers). First to fourth wafers are dummy wafers which have been subjected to an ordinary drying process that does not include a particle removing process in the processing container 31 before the particle removing process. Fifth to eighth wafers are dummy wafers subjected to a series of drying processes that include a particle removing process. Ninth to twelfth wafers are wafers that have been subjected to an ordinary drying process that does not include a particle removing processing in the processing container 31 after the particle removing process. The vertical axis of the graph illustrated in FIG. 14 indicates the number of particles adhering to the surface of each wafer (dummy wafer) after the drying process.

As illustrated in FIG. 14, it is found that a large number of particles are attached to the surface of the fifth wafer used in the first particle removing process, as compared with the first to fourth wafers processed before the particle removing process. This is considered to be because the particles adhering to the valves 131 and 132 and the second supply line 52 are discharged to the processing space by the particle removing process and then adhere to the surface of the wafer accommodated in the processing space. Also, when comparing the number of particles in the fifth wafer used in the first particle removing process with the number of particles in the eighth wafer used in the fourth particle removing process, it may be found that the eighth wafer has a smaller number of particles. This is considered to be because the number of the particles adhering to the valves 131 and 132 and the second supply line 52 is reduced by repeating the particle removing process.

In addition, when comparing the number of particles of the first to fourth wafers processed before the particle removing process with the number of particles of the ninth to twelfth wafers processed after the particle removing process, it may be found that the ninth to twelfth wafers have a smaller number of particles. This is considered to be because particles are discharged from the valves 131 and 132 and the second supply line 52 by the particle removing process, so that the number of particles ejected from the valves 131 and 132 and the second supply line 52 into the processing space during the ordinary drying process is reduced.

As described above, the drying processing unit 17 according to the embodiment may suppress that the product substrate may be contaminated when the particles attached to the second supply line 52 including the valves 131 and 132 are ejected into the processing space during the drying process on the product substrate.

<Modification>

In the embodiment described above, the valve 131 provided in the first branch supply line 52a of the second supply line 52 and the valve 132 provided in the second branch supply line 52b of the second supply line 52 are assumed to be alternately opened. The drying processing unit 17 may not be limited to this and may open the valve 131 and the valve 132 simultaneously. That is, the drying processing unit 17 may repeat, by a predetermined number of times, the operation of opening and closing the valves 131 and 132 and then waiting for a predetermined time in a state where the valves 131 and 132 are closed.

Further, in the embodiment described above, descriptions have been made on an example in which the valve 131 is provided in the first branch supply line 52a of the second supply line 52 and the valve 132 is provided in the second branch supply line 52b of the second supply line 52. However, the configuration of the second supply line 52 is not limited to the above example.

Figure 15:
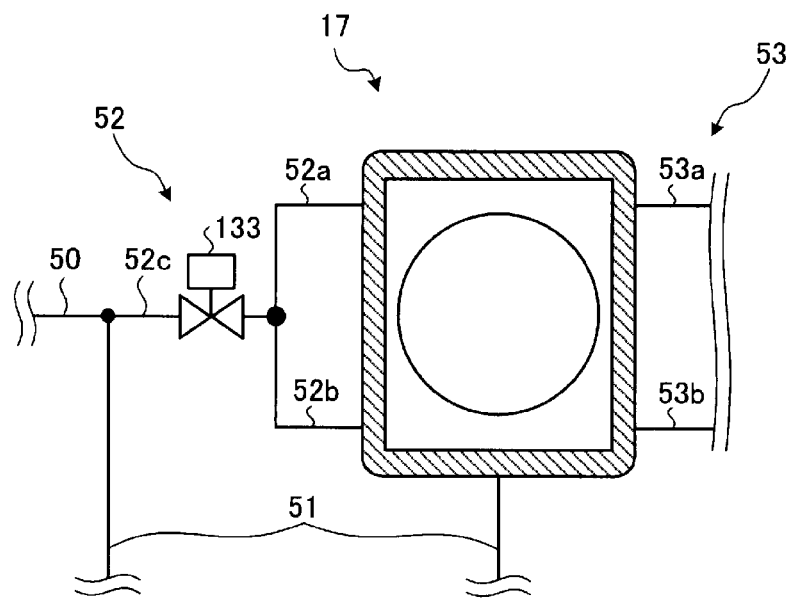
FIG. 15 is a view illustrating the configuration of a second supply line according to a modification.

FIG. 15 is a view illustrating the configuration of the second supply line 52 according to a modification. As illustrated in FIG. 15, the second supply line 52 may include, for example, a valve 133 in the upstream second supply line 52c on the upstream sides of the first branch supply line 52a and the second branch supply line 52b.

In this case, in the particle removing process, the drying processing unit 17 repeats, by a predetermined number of times, for example, an operation of opening and closing the valve 133 and then waiting for a predetermined time in a state where the valve 133 is closed. Thus, the particles attached to the second supply line 52 on the downstream side of the valves 133 and 133 may be discharged to the processing space.

In the embodiment described above, the particle removing process is assumed to be performed in a state where the dummy wafer having the IPA liquid spread thereon is accommodated in the processing space, but the particle removing process does not necessarily require a state where the dummy wafer is accommodated in the processing space.

In the above-described embodiment, descriptions have been made on an example of supplying $CO_2$ in the supercritical state to the processing space as a cleaned fluid in the particle removing process, but the cleaned fluid is not limited to $CO_2$ in the supercritical state. For example, the cleaned fluid may be IPA in a supercritical state. In this case, in the drying processing unit 17, the valve 107 and the valve 111 are opened in the pressure increasing process. As a result, IPA is supplied from the fluid supply source 56 to the upstream supply line 50. The IPA supplied to the upstream side supply line 50 is brought into a supercritical state by being heated by the heater 102 provided on the upstream side supply line 50, and then supplied to the processing space via the first supply line 51.

Also, the cleaned fluid is not limited to the fluid in the supercritical state and may be an inert gas such as $N_2$. In this case, in the drying processing unit 17, the valve 108 and the valve 111 are opened in the pressure increasing process. As a result, the inert gas is supplied from the fluid supply source 57 to the upstream supply line 50. The inert gas supplied to the upstream supply line 50 is supplied to the processing space via the first supply line 51.

As described above, the substrate processing apparatus according to the embodiment (e.g., the drying processing unit 17) is a substrate processing apparatus in which a drying process is performed to dry a substrate (e.g., a wafer W or a dummy wafer) whose surface is wet with a liquid (e.g., IPA liquid) by bringing the substrate into contact with a supercritical processing fluid (e.g., $CO_2$). The substrate processing apparatus according to the embodiment includes a processing container 31, a first supply line 51, a second supply line 52, a discharge line 53, and a controller 19. The processing container 31 has a processing space capable of accommodating a substrate. The first supply line 51 includes a first on-off valve (e.g., a valve 111) to supply the processing fluid to the processing space. The second supply line 52 includes a second on-off valve (e.g., the valves 131 and 132 or the valve 133) to supply the processing fluid to the processing space. The discharge line 53 includes a third on-off valve (e.g., valves 153 and 154), and discharges the processing fluid from the processing space. The controller 19 controls the first on-off valve, the second on-off valve, and the third on-off valve. The controller 19 executes a pressure increasing process, a circulating process, and a particle removing process. In the pressure increasing process, the pressure in the processing space is increased by supplying the cleaned fluid (e.g., a supercritical fluid, inert gas) to the processing space from the first supply line 51 in a state where the second on-off valve and the third on-off valve are closed. In the circulating process, after the pressure increasing process, the second on-off valve and the third on-off valve are opened to supply the processing fluid from the second supply line to the processing space and discharge the processing fluid from the discharge line. In the particle removing process, the second on-off valve is opened and closed during the pressure increasing process to generate a flow of the cleaned fluid in the second supply line 52 against the pressure of the processing space.

Therefore, the substrate processing apparatus according to the embodiment may suppress the product substrate from being contaminated when the particles attached to the second on-off valve and the second supply line 52 on the downstream side of the second on-off valve are ejected into the processing space.

The cleaned fluid may be an inert gas (e.g., $N_2$). Also, the cleaned fluid may be a fluid in a supercritical state (e.g., $CO_2$ in a supercritical state, IPA in a supercritical state).

The particle removing process may repeat the operation of opening and closing the second on-off valve during the pressure increasing process. This may increase the particle removal efficiency.

In addition, the second supply line 52 may branch off into the first branch supply line 52a and the second branch supply line 52b at the downstream side. In this case, the second on-off valve may include a fourth on-off valve provided on the first branch supply line 52a (e.g., the valve 131) and a fifth on-off valve provided on the second branch supply line 52b (e.g., the valve 132). Further, in the particle removing process, one of the fourth and fifth on-off valves may be opened and closed in a state where the other on-off valve is closed, and then the other on-off valve may be opened and closed in a state where the one on-off valve is closed.

As a result, a stronger fluid flow may be generated for the first branch supply line 52a and the second branch supply line 52b as compared to the case where both the fourth on-off valve and the fifth on-off valve are simultaneously opened and closed. Therefore, the particles attached to the second supply line 52 may be more reliably discharged to the processing space.

In the particle removing process, it is possible to repeat the operation of opening and closing one of the fourth and fifth on-off valves in a state where the other on-off valve is closed, and then, opening and closing the other on-off valve in a state where the one on-off valve is closed. This may increase the particle removal efficiency.

In addition, the controller 19 executes a carry-in process of carrying the substrate, on which the liquid film of IPA is formed, into the processing space before the pressure increasing process. Further, the pressure increasing process, the circulating process, and the particle removing process are performed in a state where the substrate, on which the liquid film of IPA is formed, is accommodated in the processing space. The IPA on the substrate may adsorb particles in the processing space and the second supply line 52 by being dissolved into the processing fluid in the supercritical state. Therefore, the particle removal performance may be enhanced as compared with the case where the particle removing process is performed without accommodating the substrate, on which the liquid film of IPA is formed, in the processing space.

The particle removing process may start at a timing after the pressure of the processing space has reached a critical pressure at which the processing fluid becomes in a supercritical state. This may prevent the IPA liquid from spilling out from the substrate in the particle removing process.

The substrate processing apparatus may include the upstream supply line 50. The upstream supply line 50 is connected to a supply source of a cleaned fluid (e.g., fluid supply sources 55 to 57) at one end and is connected to the first supply line 51 and the second supply line 52 at the other end. In this case, the particle removing process generates a flow of the cleaned fluid against the pressure of the processing space in the second supply line 52, by the pressure difference between the pressure applied to the second on-off valve from the upstream side of the second supply line 52, which is the supply pressure of the cleaned fluid supplied to the processing space via the upstream supply line 50 and the first supply line 51, and the pressure of the processing space applied from the downstream side of the second supply line 52 to the second on-off valve.

As a result, the pressure difference between the primary side and the secondary side of the second on-off valve during the pressure increasing process may be used to generate a flow of the cleaned fluid against the pressure of the processing space in the second supply line 52.

The first supply line 51 may be connected to a first supply header 36 that supplies the processing fluid to the processing space from below the substrate accommodated in the processing space. In addition, the second supply line 52 may be connected to a second supply header 37 that supplies the processing fluid from one side to the other side of the processing space. Also, the discharge line 53 may be provided on the other side of the processing space.

This may prevent the liquid from spilling out from the surface of the substrate in the pressure increasing process. In addition, the particles discharged to the processing space in the particle removing process may be efficiently discharged from the processing space by being carried on the flow of the processing fluid from the second supply header 37 to the discharge header 38 in the circulating process.

According to the present disclosure, in a substrate processing apparatus of drying a substrate using a processing fluid in a supercritical state, it may be suppressed that a product substrate may be contaminated when particles adhering to the supply line of the processing fluid are ejected into the processing space.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of removing particles of a substrate processing apparatus, the method comprising:
    carrying a substrate on which a liquid film of isopropyl alcohol (IPA) is formed into a processing space of a processing container;
    after the carrying the substrate, increasing a pressure of the processing space by supplying a processing fluid from a first supply line having a first on-off valve to the processing space in an initial state;
    after the increasing the pressure, supplying the processing fluid from a second supply line having a second on-off valve to the processing space and discharging the processing fluid through a discharge line having a third on-off valve by opening the second on-off valve and the third on-off valve; and
    generating a flow of the processing fluid against the pressure of the processing space in the second supply line at a timing after the initial state by opening and closing the second on-off valve during the increasing the pressure after the pressure of the processing space has reached a critical pressure of the processing fluid such that the IPA dissolves into the processing fluid to absorb particles from the second supply line,
    wherein the second on-off valve and the third on-off valve are closed in the initial state.

2. The method according to claim 1, wherein the processing fluid is an inert gas.

3. The method according to claim 2, wherein the opening and closing of the second on-off valve during the increasing the pressure is repeated.

4. The method according to claim 2, wherein the second supply line branches off into a first branch supply line and a second branch supply line at a downstream side,
    the second on-off valve includes a fourth on-off valve provided in the first branch supply line and a fifth on-off valve provided in the second branch supply line, and
    in the generating the flow of the processing fluid, one of the fourth on-off valve and the fifth on-off valve is opened and closed in a state where the other on-off valve is closed, and then the other on-off valve is opened and closed in a state where the one on-off valve is closed, during the increasing the pressure.

5. The method according to claim 2,
    wherein the increasing the pressure, the supplying the processing fluid, and the generating the flow of the processing fluid are performed in a state where the substrate on which the liquid film of the IPA is formed is accommodated in the processing space.

6. The method according to claim 2, wherein the substrate processing apparatus includes an upstream supply line which is connected to a supply source of the processing fluid at one end and is connected to the first supply line and the second supply line at the other end; and
    in the generating the flow of the processing fluid, the flow of the processing fluid is generated against the pressure of the processing space in the second supply line by a pressure difference between a pressure applied to the second on-off valve from an upstream side of the second supply line, which is a supply pressure of the processing fluid supplied to the processing space via the upstream supply line and the first supply line, and a pressure of the processing space applied from a downstream side of the second supply line to the second on-off valve.

7. The method according to claim 2, wherein the first supply line is connected to a first supply header that supplies the processing fluid to the processing space from below the substrate accommodated in the processing space,
    the second supply line is connected to a second supply header that supplies the processing fluid from one side to the other side of the processing space, and
    the discharge line is provided on the other side of the processing space.

8. The method according to claim 1, wherein the processing fluid is a fluid in a supercritical state.

9. The method according to claim 8, wherein the opening and closing of the second on-off valve during the increasing the pressure is repeated.

10. The method according to claim 8, wherein the second supply line branches off into a first branch supply line and a second branch supply line at the downstream side,
the second on-off valve includes a fourth on-off valve provided in the first branch supply line and a fifth on-off valve provided in the second branch supply line, and
in the generating the flow of the processing fluid, one of the fourth on-off valve and the fifth on-off valve is opened and closed in a state where the other on-off valve is closed, and then the other on-off valve is opened and closed in a state where the one on-off valve is closed, during the increasing the pressure.

11. The method according to claim 8,
wherein the increasing the pressure, the supplying the processing fluid, and the generating the flow of the processing fluid are performed in a state where the substrate on which the liquid film of the IPA is formed is accommodated in the processing space.

12. The method according to claim 1, wherein the opening and closing of the second on-off valve during the increasing the pressure is repeated.

13. The method according to claim 12,
wherein the increasing the pressure, the supplying the processing fluid, and the generating the flow of the processing fluid are performed in a state where the substrate on which the liquid film of the IPA is formed is accommodated in the processing space.

14. The method according to claim 1, wherein the second supply line branches off into a first branch supply line and a second branch supply line at the downstream side,
the second on-off valve includes a fourth on-off valve provided in the first branch supply line and a fifth on-off valve provided in the second branch supply line, and
in the generating the flow of the processing fluid, one of the fourth on-off valve and the fifth on-off valve is opened and closed in a state where the other on-off valve is closed, and then the other on-off valve is opened and closed in a state where the one on-off valve is closed, during the increasing the pressure.

15. The method according to claim 14, wherein the generating the flow of the processing fluid, an operation in which one of the fourth on-off valve and the fifth on-off valve is opened and closed in a state where the other on-off valve is closed, and then the other on-off valve is opened and closed in a state where the one on-off valve is closed, during the increasing the pressure, is repeated.

16. The method according to claim 1,
wherein the increasing the pressure, the supplying the processing fluid, and the generating the flow of the processing fluid are performed in a state where the substrate on which the liquid film of the IPA is formed is accommodated in the processing space.

17. The method according to claim 16, wherein the processing fluid is brought into a supercritical state after the pressure of the processing space has reached the critical pressure during the increasing the pressure.

18. The method according to claim 1, wherein the substrate processing apparatus includes an upstream supply line which is connected to a supply source of the processing fluid at one end and is connected to the first supply line and the second supply line at the other end; and
in the generating the flow of the processing fluid, a flow of the processing fluid is generated against the pressure of the processing space in the second supply line by a pressure difference between a pressure applied to the second on-off valve from an upstream side of the second supply line, which is a supply pressure of the processing fluid supplied to the processing space via the upstream supply line and the first supply line, and a pressure of the processing space applied from the downstream side of the second supply line to the second on-off valve.

19. The method according to claim 1, wherein the first supply line is connected to a first supply header that supplies the processing fluid to the processing space from below the substrate accommodated in the processing space,
the second supply line is connected to a second supply header that supplies the processing fluid from one side to the other side of the processing space, and
the discharge line is provided on the other side of the processing space.

20. A substrate processing apparatus comprising:
a processing container that includes a processing space capable of accommodating a substrate;
a first supply line having a first on-off valve and configured to supply a processing fluid to the processing space;
a second supply line having a second on-off valve and configured to supply the processing fluid to the processing space;
a discharge line having a third on-off valve and configured to discharge the processing fluid from the processing space; and
a controller configured to control an overall operation of the substrate processing apparatus,
wherein the controller is configured to perform an operation comprising:
carrying the substrate on which a liquid film of isopropyl alcohol (IPA) is formed into the processing space of the processing container;
increasing the pressure of the processing space by supplying the processing fluid from the first supply line to the processing space in an initial state where the second on-off valve and the third on-off valve are closed; and
after the increasing the pressure, supplying the processing fluid from the second supply line to the processing space and discharging the processing fluid from the discharge line by opening the second on-off valve and the third on-off valve; and
generating a flow of the processing fluid against the pressure of the processing space in the second supply line at a timing after the initial state by opening and closing the second on-off valve during the increasing the pressure after the pressure of the processing space has reached a critical pressure of the processing fluid such that the IPA dissolves into the processing fluid to absorb particles from the second supply line.

* * * * *